(12) United States Patent
Ji et al.

(10) Patent No.: US 11,238,926 B2
(45) Date of Patent: Feb. 1, 2022

(54) MEMORY CONTROLLER AND OPERATING METHOD THEREOF

(71) Applicant: SK hynix Inc., Gyeonggi-do (KR)

(72) Inventors: You Min Ji, Gyeonggi-do (KR); Keun Woo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/513,206

(22) Filed: Jul. 16, 2019

(65) Prior Publication Data

US 2020/0168272 A1 May 28, 2020

(30) Foreign Application Priority Data

Nov. 22, 2018 (KR) .................. 10-2018-0145781

(51) Int. Cl.
*G11C 11/56* (2006.01)
*G06F 13/16* (2006.01)
*G11C 16/34* (2006.01)

(52) U.S. Cl.
CPC ...... *G11C 11/5642* (2013.01); *G06F 13/1668* (2013.01); *G11C 16/349* (2013.01)

(58) Field of Classification Search
CPC . G06F 12/00; G06F 13/1668; G11C 11/5642; G11C 16/349
USPC ........................................ 711/154
See application file for complete search history.

(56) References Cited

U.S. PATENT DOCUMENTS

| 10,332,613 | B1* | 6/2019 | Micheloni | G11C 29/38 |
| 2016/0034206 | A1* | 2/2016 | Ryan | G06F 12/0246 |
| | | | | 711/103 |
| 2017/0213597 | A1* | 7/2017 | Micheloni | G11C 16/12 |
| 2019/0095135 | A1* | 3/2019 | Hsiao | G06F 3/0679 |

FOREIGN PATENT DOCUMENTS

| KR | 10-2016-0004073 | 1/2016 |
| KR | 10-2018-0042889 | 4/2018 |

* cited by examiner

*Primary Examiner* — Gautam Sain
(74) *Attorney, Agent, or Firm* — IP & T Group LLP

(57) ABSTRACT

A memory controller having an improved operation speed controls a memory device including a plurality of memory blocks. The memory controller includes: a remaining count determiner configured to determine a remaining count that is a number of program and erase operations to be additionally performed in the memory device based on a program/erase count received from the memory device, a retention period calculator configured to determine a retention period based on a power-off time and a power-on time of the memory device and a read voltage determiner configured to generate a changed read voltage table based on a default read voltage table and a coefficient determined according to the remaining count, and determine a read voltage to be used in the memory device according to the retention period among read voltages included in the changed read voltage table.

18 Claims, 14 Drawing Sheets

| AVERAGE VALUE OF PROGRAM ERASE COUNTS | REMAINING LIFESPAN OF MEMORY DEVICE |
|---|---|
| EW_COUNT≤q1 | SOL |
| q1<EW_COUNT<q2 | NORMAL |
| EW_COUNT≥q2 | EOL |

FIG. 5A

| RETENTION PERIOD | READ VOLTAGE |
|---|---|
| t1 | Vrd1 |
| t2 | Vrd2 |
| t3 | Vrd3 |

FIG. 5B

| RETENTION PERIOD | READ VOLTAGE |
|---|---|
| t1 | k1*Vrd1 |
| t2 | k1*Vrd2 |
| t3 | k1*Vrd3 |

FIG. 5C

| RETENTION PERIOD | READ VOLTAGE |
|---|---|
| t1 | k2*Vrd1 |
| t2 | k2*Vrd2 |
| t3 | k2*Vrd3 |

MEMORY CONTROLLER AND OPERATING METHOD THEREOF

CROSS-REFERENCE TO RELATED APPLICATION

The present application claims priority under 35 U.S.C. § 119(a) to Korean patent application number 10-2018-0145781, filed on Nov. 22, 2018, the entire disclosure of which is herein incorporated by reference in its entirety.

BACKGROUND

Field of Invention

The present disclosure generally relates to an electronic device, and more particularly, to a memory controller and an operating method thereof.

Description of Related Art

A storage device stores data under the control of a host such as a computer, a smart phone or a smart pad. The storage device includes a device for storing data on a magnetic disk, such as a Hard Disk Drive (HDD), or a device for storing data on a semiconductor memory, i.e., a nonvolatile memory, such as a Solid State Drive (SSD) or a memory card.

The storage device may include a memory device for storing data and a memory controller for controlling the memory device. The memory device is classified as a volatile memory device or a nonvolatile memory device. Examples of a nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Embodiments provide a memory controller having an improved operation speed and an operating method thereof.

In accordance with an aspect of the present disclosure, there is provided a memory controller including: a remaining count determiner configured to determine a remaining count that is a number of program and erase operations to be additionally performed in the memory device based on a program/erase count received from the memory device, a retention period calculator configured to determine a retention period based on a power-off time and a power-on time of the memory device and a read voltage determiner configured to generate a changed read voltage table based on a default read voltage table and a coefficient determined according to the remaining count, and determine a read voltage to be used in the memory device according to the retention period among read voltages included in the changed read voltage table.

In accordance with another aspect of the present disclosure, there is provided a method for operating a memory controller for controlling a memory device including a plurality of memory blocks, the method including: determining a remaining count that is a number of program and erase operations to be additionally performed in the memory device based on a program/erase count received from the memory device, determining a retention period, based on a power-off time and a power-on time of the memory device, generating a changed read voltage table based on a default read voltage table and a coefficient determined according to the remaining count and determining a read voltage used in the memory device according to the retention period among read voltages included in the changed read voltage table.

In accordance with another aspect of the present disclosure, there is provided a method for operating a memory controller for controlling a memory device including a plurality of memory blocks, the method including: generating retention period information based on a most recently powered-off time and a most recently powered-on time of a memory device, generating remaining count information based on a program/erase count of the memory device, adjusting a default read voltage based on the retention period information and the remaining count information and controlling the memory device to perform a read operation with the adjusted read voltage.

BRIEF DESCRIPTION OF THE DRAWINGS

Various embodiments will now be described more fully with reference to the accompanying drawings; however, aspects and features of the present invention may be embodied in different forms, configurations or arrangements. Thus, the present invention is not limited to the embodiments set forth herein. Rather, these embodiments are provided so that this disclosure is thorough and complete and fully conveys the scope of the embodiments to those skilled in the art. Also, throughout the specification, reference to "an embodiment," "another embodiment" or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A to 5C are block diagrams illustrating a default read voltage table and changed read voltage tables that are newly generated.

DETAILED DESCRIPTION

Figure 1:
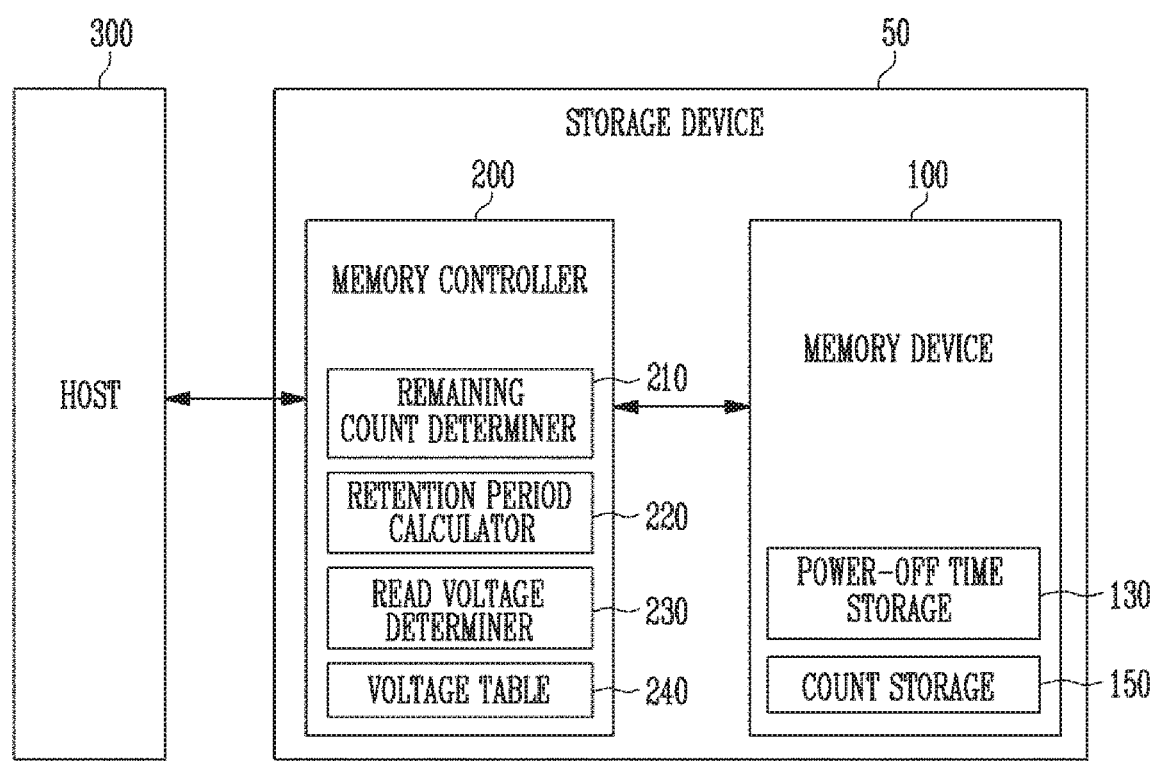
FIG. 1 is a block diagram illustrating a storage device in accordance with an embodiment of the present disclosure.

The specific structural and functional description herein is for the purpose of describing embodiments according to the concept of the present invention. The embodiments can be implemented in various forms, and thus the present invention is not limited to the embodiments set forth herein.

The embodiments of the present disclosure can be modified in various ways. While embodiments are described and illustrated herein in detail, the present invention is not limited to specific details. Rather, the present invention includes all changes, equivalents, or substitutes that do not depart from the spirit and technical scope of the present disclosure.

While terms such as "first" and "second" may be used to identify various components, such components are not limited by the above terms. The above terms are used only to distinguish one component from another that otherwise have the same or similar names. For example, a first component in one instance may be referred to as a second component in another instance, and vice versa, without departing from the scope of rights of the present invention.

It will be understood that when an element is referred to as being "connected" or "coupled" to another element, it can be directly connected or coupled to the other element or one or more intervening elements may also be present. Other expressions describing relationships between components such as "~ between," "immediately ~ between" or "adjacent to ~" and "directly adjacent to ~" may be construed similarly. Communication between two elements, whether directly or indirectly connected/coupled, may be wired or wireless, unless the context indicates otherwise.

The terms in the present application are used to describe particular embodiments, not to limit the present invention. Singular forms in the present disclosure are intended to include the plural forms as well, unless the context clearly indicates otherwise. It will be further understood that open-ended terms, such as "including" or "having," are intended to indicate the existence of the stated features, numbers, operations, actions, components, parts, or combinations thereof but are not intended to preclude the possibility that one or more other features, numbers, operations, actions, components, parts, or combinations thereof may exist or may be added.

So far as not being differently defined, all terms used herein including technical or scientific terminologies have meanings that are commonly understood by those skilled in the art to which the present disclosure pertains. Ordinary dictionary-defined terms should be understood such that they have meanings consistent with the context of the related technique. So far as not being clearly defined in this application, terms should not be understood in an ideally or excessively formal way.

In describing embodiments, description of techniques that are well known to the art to which the present disclosure pertains and not directly related to the present disclosure is omitted. This is done to avoid unnecessarily obscuring the present invention.

Various embodiments of the present disclosure will be described in detail below with reference to the accompanying drawings in order for those skilled in the art to be able to readily implement or practice the present invention.

FIG. 1 is a block diagram illustrating a storage device.

Referring to FIG. 1, the storage device 50 may include a memory device 100 and a memory controller 200.

The storage device 50 may store data under the control of a host 300, such as a mobile phone, a smart phone, an MP3 player, a laptop computer, a desktop computer, a game console, a TV, a tablet PC or an in-vehicle infotainment.

The storage device 50 may be configured as any of various types of storage devices according to a host interface that is a communication scheme with the host 300. For example, the storage device 50 may be implemented with any one of various types of storage devices such as a multi-media card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Serial Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-e or PCIe) card type, a Compact Flash (CF) card, a smart media card, and a memory stick.

The storage device 50 may be manufactured as any of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

The memory controller 200 may include a remaining count determiner 210. The remaining count determiner 210 may receive a program/erase count EW_COUNT from the memory device 100. The program/erase count EW_COUNT may be obtained by counting a number of program and erase operations performed in the memory device 100. The remaining count determiner 210 may determine a remaining count based on the program/erase count EW_COUNT. The remaining count may be a number of program and erase operations that can be additionally performed in the memory device 100 during the remaining lifespan of the memory device 100. Therefore, the remaining count may be indicative of the remaining lifespan of the memory device 100.

The remaining count determiner 210 may generate remaining count information RC_INF including a remaining count and a coefficient corresponding to the remaining count. The remaining count determiner 210 may output the remaining count information RC_INF to a read voltage determiner 230. The remaining count may be determined based on the program/erase count EW_COUNT.

The memory controller 200 may include a retention period calculator 220. The retention period calculator 220 may determine a retention period based on a power-off time PO_TIME and a power-on time of the memory device 100. The power-off time PO_TIME of the memory device 100 may be received from the memory device 100. The power-off time PO_TIME of the memory device 100 may be a time at which power applied to the memory device 100 was turned off or otherwise interrupted. The power-on time of the memory device 100 may be a time at which the power is subsequently applied to the memory device 100.

Therefore, the retention time calculator 220 may calculate, as the retention period, the period from the time at which the power applied to the memory device 100 was turned off or otherwise interrupted to the time at which the power is subsequently applied to the memory device 100.

The memory controller 200 may include the read voltage determiner 230. The read voltage determiner 230 may determine a read voltage used in the memory device 100. The read voltage used in the memory device 100 may be determined based on the program/erase count EW_COUNT and the retention period.

Specifically, the read voltage determiner 230 may generate a changed read voltage table based on a default read voltage table and a coefficient determined according to a remaining count. The changed read voltage tables may be changed from the default read voltage table. The read voltage determiner 230 may determine a read voltage corresponding to the retention period, which is determined by the retention time calculator 220, among read voltages included in the changed read voltage table. The read voltage determiner 230 may generate read voltage information RV_INF including the determined read voltage. The read voltage determiner 230 may output the read voltage information RV_INF to the memory device 100. The memory device 100 may change the read voltage used in the memory device 100, based on the read voltage information RV_INF.

The memory controller 200 may include a voltage table 240. The voltage table 240 may include a default read voltage table and the changed read voltage tables. The default read voltage table may include read voltages according to retention periods, which may periods between power-off times and respective subsequent power-on times. Specifically, the read voltages included in the default read voltage table may correspond to respective retention periods. The voltage table 240 may be implemented by using a memory.

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 100 may be configured as a Single Level Cell (SLC) for storing one data bit, a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory device 100 may perform a program operation or an erase operation with a set operating voltage under the control of the memory controller 200.

The memory device 100 may include a power-off time storage 130. The power-off time storage 130 may store a power-off time PO_TIME of the memory device 100. The power-off time PO_TIME may be a start time when a retention period is calculated.

When the power is applied to the memory device 100, the power-off time storage 130 may output the stored power-off time PO_TIME to the retention period calculator 220. The retention period calculator 220 may calculate a retention period based on the received power-off time PO_TIME. Alternatively, the power-off time storage 130 may output the stored power-off time PO_TIME to the retention period calculator 220 in response to a request from the memory controller 200, in addition to when the power is applied to the memory device 100.

The memory device 100 may include a count storage 150 that may store the program/erase count EW_COUNT. Whenever a program or erase operation is performed in the memory device 100, the count storage 150 may increment the program/erase count and store the current program/erase count EW_COUNT, which is an accumulation of all program and erase operations performed in the memory device 100 since the count was initialized. The count storage 150 may output the current program/erase count EW_COUNT to the remaining count determiner 210 in response to a request from the memory controller 200.

The count storage 150 may store the program/erase count EW_COUNT for each memory block. The count storage 150 may output the program/erase count EW_COUNT stored for each memory block to the remaining count determiner 210 in response to a request from the memory controller 200. The remaining count determiner 210 may determine the remaining count based on the program/erase count EW_COUNT received from the count storage 150. The remaining count may be determined based on an average value, median value, maximum value or minimum value of multiple program/erase counts EW_COUNTs received from the count storage 150 over a period of time.

In an embodiment, the memory controller 200 may receive data and a Logical Address (LA) from the host 300, and translate the LA into a Physical Address (PA) representing addresses of memory cells included in the memory device 100, in which data is to be stored. Also, the memory controller 200 may store, in a buffer memory, mapping information that establishes a mapping relationship between the LA and the PA.

The memory controller 200 may control the memory device 100 to perform a program operation, a read operation, an erase operation, or the like in response to a request from the host 300. In the program operation, the memory controller 200 may provide a program command, a PA, and data to the memory device 100. In the read operation, the memory controller 200 may provide a read command and a PA to the memory device 100. In the erase operation, the memory controller 200 may provide an erase command and a PA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance.

The host 300 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figures 2, 3:
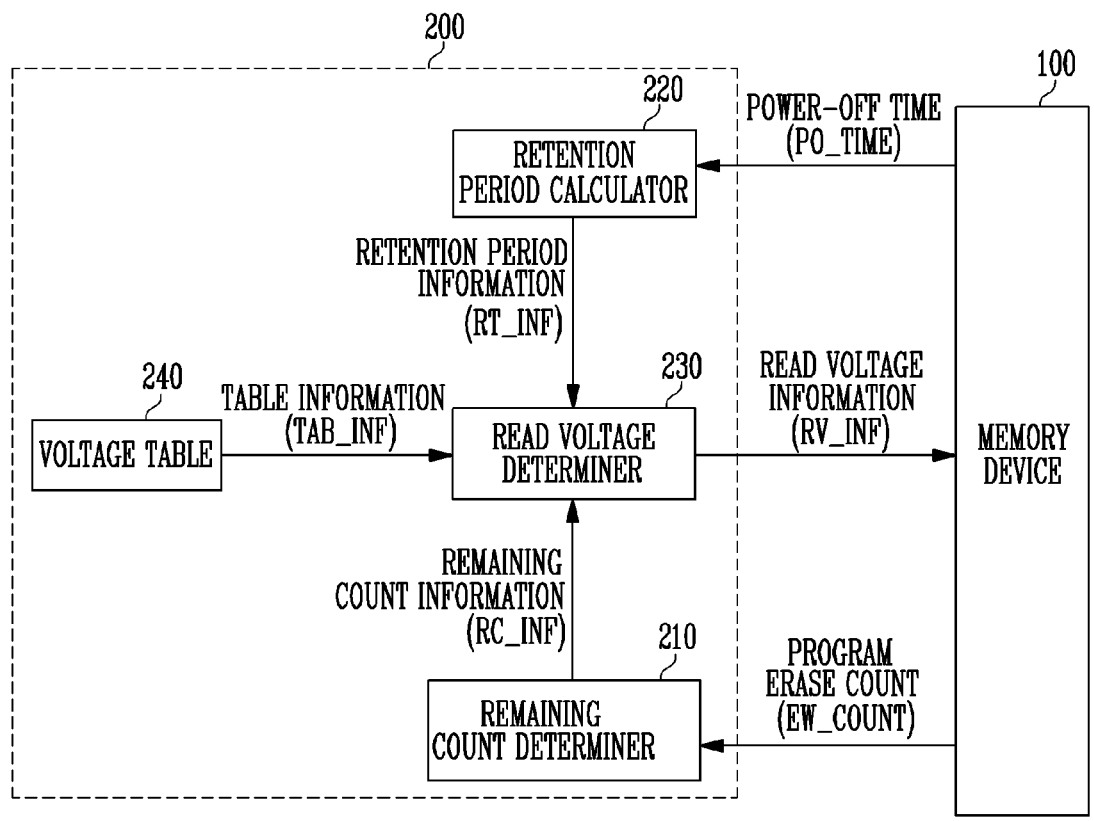
FIG. 2 is a diagram illustrating a configuration of a memory controller, such as that shown in FIG. 1, and a method for determining a read voltage used in a memory device, such as that shown in FIG. 1.
FIG. 3 is a diagram illustrating a relation between an average value of program/erase counts and a remaining lifespan of a memory device.

FIG. 2 is a diagram illustrating a configuration of the memory controller shown in FIG. 1 and a method for determining a read voltage used in the memory device shown in FIG. 1.

Referring to FIG. 2, the memory controller 200 may include the remaining count determiner 210, the retention period calculator 220, the read voltage determiner 230, and the voltage table 240.

The remaining count determiner 210 may receive a program/erase count EW_COUNT from the memory device 100. The program/erase count EW_COUNT may be a number of program and erase operations for each memory block, which numbers may be obtained through a counting operation. That is, the program/erase count EW_COUNT represents multiple counts, one for each memory block. Alternatively, the program/erase count EW_COUNT comprises a plurality of individual counts for the respective memory blocks. Therefore, the remaining count determiner 210 may receive a program/erase count EW_COUNT for each memory block from the memory device 100. In an embodiment, the remaining count determiner 210 may receive a program/erase count EW_COUNT from the count storage 150.

When power is applied to the memory device 100, the remaining count determiner 210 may receive a program/erase count EW_COUNT from the memory device 100.

The remaining count determiner 210 may determine a remaining count based on the program/erase count EW_COUNT. The remaining count may be a number of program and erase operations to be additionally performed in the memory device 100 during the remaining lifespan of the memory device 100. Thus, the remaining count may be indicative of the remaining lifespan of the memory device 100.

In an embodiment, the remaining count may be determined based on an average value or median value of multiple program/erase counts EW_COUNT received from the memory device 100 over a specific period of time. Alternatively, the remaining count may be determined based on a maximum value or minimum value among the program/erase counts EW_COUNT received from the memory device 100.

Specifically, a lifespan of the memory device 100 may be determined according to a number of program and erase operations to be performed in the memory device 100. Therefore, a total lifespan of the memory device 100 may be determined according to a total number of program and erase operations that can be performed from beginning to end in the memory device 100. In addition, a remaining lifespan of the memory device 100 may be determined according to a number of program and erase operations that can be performed in the future in the memory device 100.

In an embodiment, the remaining count determiner 210 may generate and output remaining count information RC_INF including information on the remaining count and the coefficient determined according to the remaining count. Specifically, the remaining count may represent a number of program or erase operations that can be additionally performed in the memory device 100. That is, the remaining count may represent a remaining lifespan of the memory device 100. The remaining count and the coefficient corresponding thereto may decrease when the program/erase count EW_COUNT increases.

The remaining count determiner 210 may output the remaining count information RC_INF to the read voltage determiner 230. The read voltage determiner 230 may generate a read voltage table based on the remaining count information RC_INF.

The retention period calculator 220 may determine a retention period based on a power-off time PO_TIME and a power-on time of the memory device 100. The power-off time PO_TIME may be a time at which the power applied to the memory device 100 was off. The power-off time PO_TIME may be a start time when the retention period is calculated. When the power is applied to the memory device 100, the retention period calculator 220 may receive the power-off time PO_TIME from the power-off time storage 130. Alternatively, the retention period calculator 220 may receive the power-off time PO_TIME from the power-off time storage 130 in response to a request from the memory controller 200. The retention period calculator 220 may calculate a retention period, based on the power-off time PO_TIME received from the power-off time storage 130.

The retention period calculator 220 may determine a power-on time based on a power-on state sensed in the host 300 or the memory controller 200. The power-on time of the memory device 100 may be a time at which the power starts to be applied to the memory device 100. The power-on time may be an end time of the retention period.

The retention period calculator 220 may calculate as the retention period the period from the time at which the power applied to the memory device 100 was turned off or otherwise interrupted to the time at which the power is subsequently applied to the memory device 100. The retention period calculator 220 may generate retention period information RT_INF including information on the retention period. The retention period calculator 220 may output the retention period information RT_INF to the read voltage determiner 230.

The read voltage determiner 230 may determine a read voltage used in the memory device 100. The read voltage used in the memory device 100 may be determined according to the program/erase count EW_COUNT and the retention period.

In an embodiment, the read voltage determiner 230 may receive the remaining count information RC_INF from the remaining count determiner 210.

In an embodiment, the read voltage determiner 230 may receive retention period information RT_INF from the retention period calculator 220.

The read voltage determiner 230 may receive table information TAB_INF of a table included in the voltage table 240. The table information TAB_INF may include information on a default read voltage table determined by one of a plurality of remaining lifespans and the one of a plurality of remaining lifespans of the memory device 100. The default read voltage table may include read voltages respectively corresponding to retention periods.

In an embodiment, the read voltage determiner 230 may generate the changed read voltage table based on the default read voltage table from the table information TAB_INF and the coefficient from the remaining count information RC_INF.

Voltages included in the changed read voltage table may be obtained by multiplying read voltages included in the default read voltage table by the coefficient in the remaining count information RC_INF. That is, the read voltage determiner 230 may generate the changed read voltage table based on the remaining lifespan of the memory device 100, which determines the default read voltage table, and the coefficient corresponding to the remaining count.

The read voltage determiner 230 may determine a read voltage corresponding to the retention period, which is included in the retention period information RT_INF, among read voltages included in the changed read voltage table. The read voltage determiner 230 may generate read voltage information RV_INF including the determined read voltage. The read voltage determiner 230 may output the read voltage information RV_INF to the memory device 100.

The memory controller 200 may include the voltage table 240. The voltage table 240 may include the default read voltage table. The default read voltage table may include read voltages respectively corresponding to retention periods. Voltages included in the default read voltage table may be decreased as the retention period becomes longer. In an embodiment, the default read voltage table may be generated based on a default program/erase count EW_COUNT. The default read voltage table may be used when the remaining lifespan of the memory device 100 is Start Of Life (SOL).

The voltage table 240 may generate the table information TAB_INF and output the table information TAB_INF to the read voltage determiner 230. The table information TAB_INF may include information on a default read voltage table and the remaining lifespan of the memory device 100, which determines the default read voltage table. The remaining lifespan of the memory device 100 may be any of End Of Life (EOL), NORMAL, and Start Of Life (SOL). The read voltage determiner 230 may generate the changed read voltage table based on the default read voltage table from the table information TAB_INF. In an embodiment, the changed read voltage table may be generated by multiplying read voltages of the default read voltage table of the Start Of Life (SOL) by the coefficient from the remaining count information RC_INF.

FIG. 3 is a diagram illustrating a relation between an average value of program/erase counts EW_COUNT and a remaining lifespan of the memory device 100.

Referring to FIG. 3, a first column shown in FIG. 3 represents average value of the program/erase counts EW_COUNT. A second column shown in FIG. 3 represents remaining lifespan of the memory device 100. In FIG. 3, q1 and q2 are natural numbers larger than 1. In addition, q2 is larger than q1. For example, q1 is a value of the program/erase count EW_COUNT, which may be "1000". q2 is also a value of the program/erase count EW_COUNT, which may be "10000", greater than q1.

The average value of program/erase counts EW_COUNT, which is represented by the first column, may be an average value of values obtained by counting numbers of program and erase operations performed in respective memory blocks in the memory device 100. In another embodiment, the program/erase counts EW_COUNT may be a median value of values obtained by counting numbers of program and erase operations performed in respective memory blocks in the memory device 100 or a maximum value or minimum value among the counted values.

A remaining count may be determined based on the program/erase count EW_COUNT. The remaining count may be a number of program and erase operations to be additionally performed in the memory device 100. The number of program and erase operations to be additionally performed in the memory device 100 may indicate a remaining lifespan of the memory device 100.

The remaining lifespan of the memory device 100, which is represented by the second column, may be determined based on the average value of program/erase counts EW_COUNT, which is represented by the first column.

In an embodiment, the average value of program/erase counts EW_COUNT may be no more than q1. When the average value of program/erase counts EW_COUNT is no more than q1, the memory device 100 may additionally perform program and erase operations, the number of which corresponds to a remaining count determined according to the program/erase count EW_COUNT. The number of program and erase operations to be additionally performed in the memory device 100 may be obtained by subtracting the average value of program/erase counts EW_COUNT from the total number of program and erase operation to be performed in the memory device 100.

Therefore, when the average value of program/erase counts EW_COUNT is no more than q1, the memory device 100 may additionally perform a large number of program and erase operations. Consequently, when the average value of program/erase counts EW_COUNT is no more than q1, the remaining lifespan of the memory device 100 may be determined as Start Of Life (SOL). When the remaining lifespan of the memory device 100 is the SOL, a relatively large number of program and erase operations may be performed in the memory device 100.

In an embodiment, the average value of program/erase counts EW_COUNT may be no less than q2. When the average value of program/erase counts EW_COUNT is no less than q2, the memory device 100 may additionally perform program and erase operations. The memory device 100 may additionally perform program and erase operations by a remaining count determined according to the program/erase count EW_COUNT. The number of program and erase operations to be additionally performed in the memory device 100 may be a value obtained by subtracting the average value of program/erase counts EW_COUNT from the total number of program and erase operation to be performed in the memory device 100.

Specifically, when the average value of program/erase counts EW_COUNT is no less than q2, the remaining count may be less than that when the average value of program/erase counts EW_COUNT is no more than q1. Therefore, when the average value of program/erase counts EW_COUNT is no less than q2, the remaining count is small, and hence a remaining lifespan of the memory device 100 may be determined to be shorter than that when the average value of program/erase counts EW_COUNT is no more than q1. That is, when the average value of program/erase counts EW_COUNT is no less than q2, a number of program and erase operations to be additionally performed in the memory device 100 may be less than that when the average value of program/erase counts EW_COUNT may be no more than q1. Consequently, when the average value of program/erase counts EW_COUNT is no less than q2, the remaining lifespan of the memory device 100 may be determined as End Of Life (EOL). When the remaining lifespan of the memory device 100 is the EOL, a relatively small number of program and erase operations may be performed in the memory device 100.

In an embodiment, the average value of program/erase counts EW_COUNT may be larger than q1 and be smaller than q2. When the average value of program/erase counts EW_COUNT is larger than q1 and is smaller than q2, the memory device 100 may additionally perform program and erase operations. The memory device 100 may additionally perform program and erase operations by a remaining count determined according to the program/erase count EW_COUNT. A number of program and erase operations to be additionally performed in the memory device 100 may be larger than that when the average value of program/erase counts EW_COUNT is no less than q2, and be smaller than that when the average value of program/erase counts EW_COUNT may be no more than q1.

Specifically, when the average value of program/erase counts EW_COUNT is larger than q1 and is smaller than q2, a remaining count may be larger than that when the average value of program/erase counts EW_COUNT is no less than q2, and be smaller than that when the average value of program/erase counts EW_COUNT is no more than q1. Therefore, a remaining lifespan of the memory device 100 may be determined to be shorter than that when the average value of program/erase counts EW_COUNT is no more than q1 and be longer than that when the average value of program/erase counts EW_COUNT is no less than q2. Consequently, when the average value of program/erase counts EW_COUNT is larger than q1 and is smaller than q2, the remaining lifespan of the memory device 100 may be determined as NORMAL.

Figure 4A:
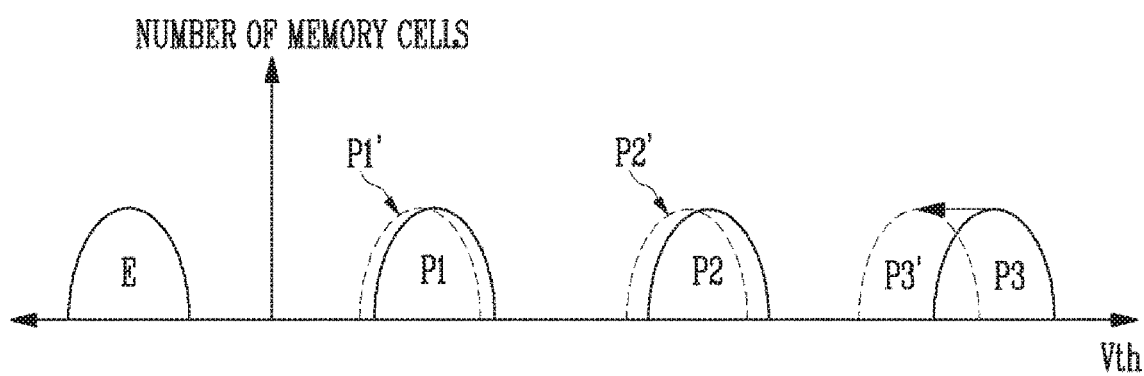
FIGS. 4A to 4B are diagrams illustrating a threshold voltage of a memory cell, which varies depending on a program/erase count and a retention period.
Figure 4B:
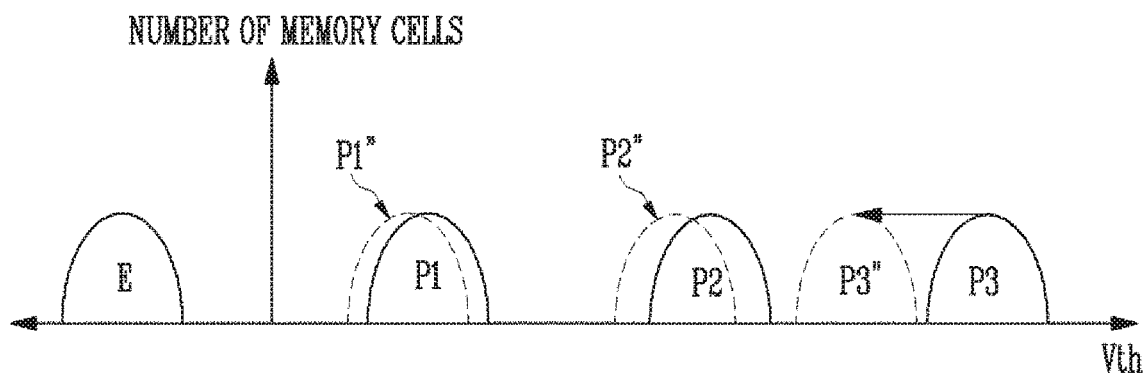

FIGS. 4A to 4B is a diagram illustrating a threshold voltage of a memory cell, which changes depending on the program/erase count EW_COUNT and the retention period of the memory device 100.

Referring to FIGS. 4A to 4B, a horizontal axis represents threshold voltage according to states of memory cells, and a vertical axis represents number of memory cells. FIG. 4A illustrates a change in the threshold voltage distribution according to a retention period. FIG. 4B illustrates a further change in the threshold voltage distribution according to a program/erase count EW_COUNT. In FIGS. 4A to 4B, it is assumed that a program/erase count EW_COUNT shown in FIG. 4A is smaller than that EW_COUNT shown in FIG. 4B.

FIGS. 4A to 4B represent a case where a memory cell stores data corresponding to two bits. The memory cell may be programmed to have a threshold voltage corresponding to any one of an erase state E, a first program state P1, a second program state P2, and a third program state P3.

The erase state E may correspond to data '11,' the first program state P1 may correspond to data '10,' the second program state P2 may correspond to data '00,' and the third program state P3 may correspond to data '01.' However, the data corresponding to the respective program states are merely illustrative, and may be variously modified.

Referring to FIG. 4A, the threshold voltage distribution of the memory cell may be changed depending on a retention period, which may be determined as previously explained. In addition, a change in threshold voltage distribution may be changed depending on a program state of the memory cell.

When the retention period increases, the movement of charges trapped in a Floating Gate (FG) of the memory cell may increase. Therefore, when the movement of charges trapped in the FG increases, the threshold voltage of the memory cell may be decreased. Consequently, when the retention period increases, the threshold voltage of the memory cell may be decreased.

In addition, a change in threshold voltage distribution of the memory cell may be changed depending on a program state of the memory cell. That is, the change in threshold voltage distribution of the memory cell may be changed depending on a number of charges trapped in the FG. When the program state becomes higher, the number of charges trapped in the FG of the memory cell increases. Hence, a change in threshold voltage distribution in a high program state may be larger than that in threshold voltage distribution in a low program state.

That the number of charges trapped in the FG of the memory cell increases may mean that the number of charges discharged from the FG increases. Therefore, when the program state of the memory cell becomes higher, the change in threshold voltage distribution may become larger.

In an embodiment, the threshold voltage distribution may be changed based on the retention period and the program state. Specifically, when the retention period increases, the threshold voltage distribution corresponding to the first program state P1 may be changed to a threshold voltage corresponding to state P1', the threshold voltage distribution corresponding to the second program state P2 may be changed to a threshold voltage distribution corresponding to state P2', and the threshold voltage distribution corresponding to the third program state P3 may be changed to a threshold voltage distribution corresponding to state P3'.

Since the threshold voltage distribution becomes higher from the first program state P1 to the third program state P3, a change in threshold voltage distribution of memory cells in the third program state P3 may be largest. That is, the change in threshold voltage distribution may become larger when the program state becomes higher.

Referring to FIG. 4B, a further change in threshold voltage distribution may be made according to a program/erase count EW_COUNT.

Like FIG. 4A, in FIG. 4B, when the retention period increases, the threshold voltage distribution corresponding to the first program state P1 may be changed to a threshold voltage distribution corresponding to state P1", the threshold voltage distribution corresponding to the second program state P2 may be changed to a threshold voltage distribution corresponding to state P2", and the threshold voltage distribution corresponding to the third program state P3 may be changed to a threshold voltage distribution corresponding to state P3". The threshold voltage distribution may be changed based on the program/erase count EW_COUNT in addition to the retention period.

Specifically, the program/erase count EW_COUNT may be obtained by counting a number of program and erase operations performed in the memory device 100. A remaining count may be determined based on the program/erase count EW_COUNT. When the program/erase count EW_COUNT increases, the movement of charges trapped in the FG may increase. That is, when a large number of program and erase operations are performed on the memory cell, the program/erase count EW_COUNT may increase. Therefore, when the program/erase count EW_COUNT increases, the discharge of charges trapped in the FG may increase. When the discharge of charges trapped in the FG increases, the threshold voltage of the memory cell may be lowered. Consequently, when the program/erase count EW_COUNT increases, the change in threshold voltage distribution of the memory cell may become larger.

Since the program/erase count EW_COUNT of FIG. 4B is larger than that of FIG. 4A, the change in threshold voltage distribution in FIG. 4B may be relatively larger than that in FIG. 4A, in spite of the same program state. Specifically, in the change in threshold voltage distribution corresponding to the first program state P1 according to the retention period, the change from P1 to P1" may be larger than that from P1 to P1'. In the change in threshold voltage distribution corresponding to the second program state P2 according to the retention period, the change from P2 to P2" may be larger than that from P2 to P2'. In the change in threshold voltage distribution corresponding to the third program state P3 according to the retention period, the change from P3 to P3" may be larger than that from P3 to P3'.

Consequently, FIG. 4A illustrates a change in threshold voltage distribution of the memory cell in consideration of only the retention period, but FIG. 4B illustrates a change in threshold voltage distribution of the memory cell in consideration of the program/erase count EW_COUNT in addition to the retention period. Therefore, when the retention period becomes longer, and the program/erase count EW_COUNT becomes larger, the change in threshold voltage distribution may become larger.

FIGS. 5A to 5C illustrate a default read voltage table and changed read voltage tables.

FIG. 5A illustrates a default read voltage table, and FIGS. 5B to 5C illustrate changed read voltage tables generated based on the default read voltage table and the coefficient corresponding to the remaining count. Although FIGS. 5A to 5C show tables with respect to retention periods t1 to t3, other retention periods may be included in the tables. It is assumed that FIG. 5C is a changed read voltage table generated when a program/erase count EW_COUNT is larger than that in FIG. 5B.

FIGS. 5A to 5C may include read voltages corresponding to the same retention period. The read voltages corresponding to the same retention period may have a constant ratio.

Specifically, when the retention period is t1, the read voltages of FIGS. 5A to 5C may be Vrd1, k1*Vrd1, and k2*Vrd1, respectively. The coefficients k1 and k2 may be decimals, and k1 may be greater than k2. When the read voltages correspond to the same retention period, the ratio between two of the read voltages may be k1, k2 or k1/k2. When the retention period is t2, the read voltages FIGS. 5A to 5C may be Vdr2, k1*Vdr2, and k2*Vdr2, respectively. Therefore, when the read voltages correspond to the same retention period, the ratio between two of the read voltages may be k1, k2 or k1/k2. When the retention period is t3, the read voltages FIGS. 5A to 5C may be Vdr3, k1*Vdr3, and k2*Vdr3, respectively. Therefore, when the read voltages correspond to the same retention period, the ratio between two of the read voltages may be k1, k2 or k1/k2.

Consequently, a coefficient corresponding to a remaining count determined according to the program/erase count EW_COUNT may represent such a ratio. The coefficient determined based on the remaining count may be k1 or k2. The coefficients k1 and k2 may be heuristically obtained according to the remaining count in advance and pre-stored in the voltage table 240. For example, k1 may be "0.2" indicating that a remaining lifespan is 20% of total lifespan and k2 may be "0.8" indicating that a remaining lifespan is 80% of total lifespan. The changed read voltage table may be generated by multiplying voltages included in the default read voltage table by the coefficient corresponding to the remaining count.

The default read voltage table may include read voltages corresponding to a retention period. The read voltages may be voltages used in the memory device 100. Specifically, the retention period may be a period from the time at which power of the memory device 100 is off to the time at which the power is then applied to the memory device 100. The default read voltage table may be a table based on a specific remaining lifespan of the memory device 100. That is, the default read voltage table may be a table based on only the retention period. The default read voltage table may be a read voltage table according to the retention period when the remaining lifespan of the memory device 100 is any of End Of Life (EOL), NORMAL, and Start Of Life (SOL). In an embodiment, the default read voltage table may be a voltage table when the remaining lifespan of the memory device 100 is the SOL.

In FIG. 5A, when the retention period is t1, the read voltage may be Vrd1. When the retention period is t2, the read voltage may be Vrd2. When the retention period is t3, the read voltage may be Vrd3. When the retention period increases, the read voltage may be lowered. Therefore, when the retention period increases from t1 to t3, the read voltage may be gradually lowered from Vrd1 to Vrd3.

In an embodiment, a changed read voltage table may be generated based on the default read voltage table and the coefficient corresponding to the remaining count. The changed read voltage table may be obtained by changing the default read voltage table.

When the program/erase count EW_COUNT increases or when the remaining count decreases, the threshold voltage distribution of the memory cell is lowered, and hence the read voltage may be lowered. Therefore, the coefficient determined according to the remaining count may decrease when the program/erase count EW_CONUNT increases. In order to determine a read voltage based on the program/erase count EW_COUNT or the remaining count, the read voltage determiner 230 may generate a changed read voltage table by multiplying voltages included in the default read voltage table by the coefficient determined according to the remaining count.

In an embodiment, FIG. 5B is a changed read voltage table when the coefficient determined according to the remaining count is k1, and FIG. 5C is a changed read voltage table when the coefficient determined according to the remaining count is k2. k1 and k2 may be determined according the program/erase count EW_COUNT. Therefore, k1 and k2 may be determined according to the remaining count. When the program/erase count EW_COUNT increases, the remaining count and coefficients k1 and k2 corresponding to the remaining count may decrease. That is, when the program/erase count EW_COUNT increases, the threshold voltage distribution of the memory cell is lowered, and therefore, the read voltage determiner 230 may generate the changed read voltage table by multiplying the read voltages included in the default read voltage table by k1 or k2. k1 and k2 may be decimals.

In an embodiment, FIG. 5B may be a read voltage table generated when a program/erase count EW_COUNT is smaller than that in FIG. 5C. When the program/erase count EW_COUNT is small, the remaining count may be large. Since the program/erase count EW_COUNT is small, the remaining count and the coefficient corresponding to the remaining count may become large. Consequently, k1 that is a coefficient corresponding to the remaining count may be larger than k2. Therefore, when read voltages correspond to the same retention period, a read voltage included in FIG. 5B, which corresponds to the retention period, may be larger than that included in FIG. 5C, which corresponds to the retention period. Therefore, when the program/erase count EW_COUNT is small, the read voltage determiner 230 may generate a read voltage table configured with voltages larger than those when the program/erase count EW_COUNT is large.

Figure 6:
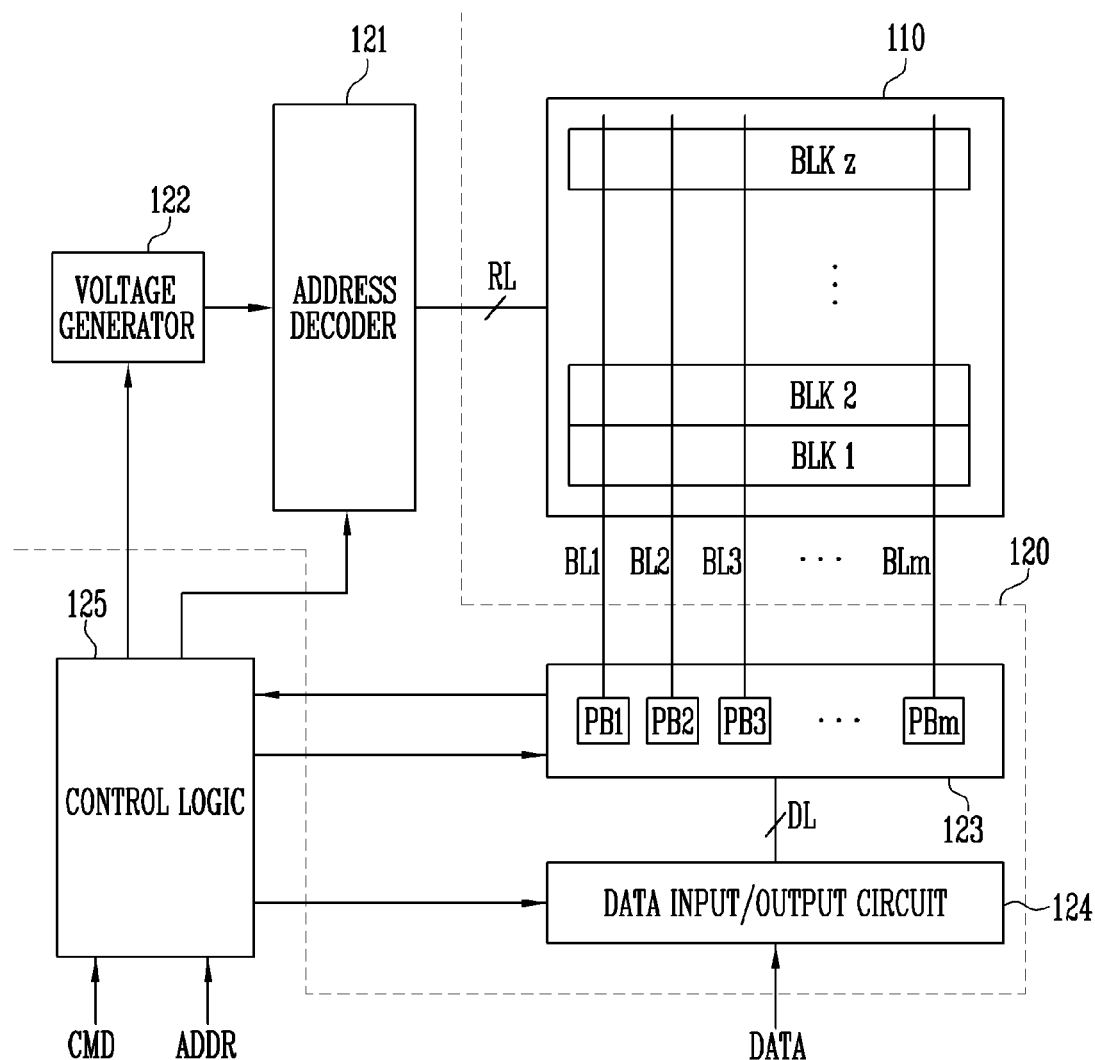
FIG. 6 is a block diagram illustrating a structure of a memory device, such as that shown in FIG. 1.

FIG. 6 is a block diagram illustrating a structure of the memory device shown in FIG. 1.

Referring to FIG. 6, the memory device 100 includes a memory cell array 110, a peripheral circuit 120, and control logic 125.

The memory cell array 110 may include a plurality of memory blocks BLK1 to BLKz. The plurality of memory blocks BLK1 to BLKz are coupled to an address decoder 121 through row lines RL, and are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells.

A plurality of memory cells included in the memory cell array may be grouped into a plurality of blocks according to usage thereof. System information as various setting information necessary to control the memory device 100 may be stored in the plurality of blocks.

Each of first to zth memory blocks BLK1 to BLKz includes a plurality of cell strings. First to mth cell strings are coupled to first to mth bit lines BL1 to BLm, respectively. Each of the first to mth cell strings includes a drain select transistor, a plurality of memory cells coupled in series, and a source select transistor. The drain select transistor is coupled to a drain select line. First to nth memory cells are coupled to first to nth word lines. The source select transistor is coupled to a source select line. A drain side of the drain select transistor is coupled to a corresponding bit line. The drain select transistors of the first to mth cell strings are coupled to the first to mth bit lines BL1 to BLm, respectively. A source side of the source select transistor is coupled to a common source line. In an embodiment, the common source line may be commonly coupled to the first to zth memory blocks BLK1 to BLKz. The drain select line DSL, the first to nth word lines, and the source select line are included in the row lines RL. The drain select line DSL, the first to nth word lines, and the source select line are controlled by the address decoder 121. The common source line is controlled by the control logic 125. The first to mth bit lines BL1 to BLm are controlled by the read/write circuit 123.

The peripheral circuit 120 includes the address decoder 121, a voltage generator 122, the read/write circuit 123, and a data input/output circuit 124.

The address decoder 121 is coupled to the memory cell array 110 through the row lines RL. The address decoder 121 is configured to operate under the control of the control logic 125. The address decoder 121 receives an address ADDR through the control logic 125.

In an embodiment, a program operation and a read operation of the memory device 100 are performed in units of pages.

In the program and read operations, the address ADDR received by the control logic 125 may include a block address and a row address. The address decoder 121 is configured to decode the block address in the received address ADDR. The address decoder 121 selects one memory block among the memory blocks BLK1 to BLKz according to the decoded block address.

The address decoder 121 is configured to decode the row address in the received address ADDR. The address decoder 121 selects one word line of a selected memory block by applying voltages provided from the voltage generator 122 to the row lines RL according to the decoded row address.

In an erase operation, the address ADDR includes a block address. The address decoder 121 decodes the block address, and selects one memory block according to the decoded block address. The erase operation may be performed on the whole or a portion of the one memory block.

In a partial erase operation, the address ADDR may include block and row addresses. The address decoder 121 selects one memory block among the memory blocks BLK1 to BLKz according to the block address.

The address decoder 121 is configured to decode the row addresses in the received address ADDR. The address decoder 121 selects at least one word line of the selected memory block by applying voltages provided from the voltage generator 122 to the row lines RL according to the decoded row addresses.

In an embodiment, the address decoder 121 may include a block decoder, a word line decoder, an address buffer, and the like.

The voltage generator 122 generates a plurality of voltages, using an external power voltage supplied to the memory device 100. The voltage generator 122 operates under the control of the control logic 125.

In an embodiment, the voltage generator 122 may generate an internal power voltage by regulating the external power voltage. The internal power voltage generated by the voltage generator 122 is used as an operating voltage of the memory device 100.

In an embodiment, the voltage generator 122 may generate a plurality of voltages, using the external power voltage or the internal power voltage.

For example, the voltage generator 122 may include a plurality of pumping capacitors for receiving the internal power voltage, and generate a plurality of voltages by selectively activating the plurality of pumping capacitors under the control of the control logic 125. The plurality of generated voltages are applied to word lines selected by the address decoder 121.

In a program operation, the voltage generator 122 may generate a high-voltage program pulse and a pass pulse lower than the program pulse. In a read operation, the voltage generator 122 may generate a read voltage and a pass voltage higher than the read voltage. In an erase operation, the voltage generator 122 may generate an erase voltage.

The read/write circuit 123 includes first to mth page buffers PB1 to PBm. The first to mth page buffers PB1 to PBm are coupled to the memory cell array 110 respectively through the first to mth bit lines BL1 to BLm. The first to mth page buffers PB1 to PBm operate under to control of the control logic 125.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, when a program pulse is applied to a selected word line, the first to mth page buffers PB1 to PBm may transfer the data DATA received through the data input/out circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) is applied may be maintained. In a program verify operation, the first to mth page buffers PB1 to PBm read page data from selected memory cells through the bit lines BL1 to BLm.

In a read operation, the read/write circuit 123 reads data DATA from memory cells of a selected page through the bit lines BL, and outputs the read data DATA to the data input/output circuit 124. In an erase operation, the read/write circuit 123 may float the bit lines BL.

In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 125. In a program operation, the data input/output circuit 124 receives data DATA to be stored from an external controller (not shown).

The control logic 125 is coupled to the address decoder 121, the voltage generator 122, the read/write circuit 123, and the data input/output circuit 124. The control logic 125 may control overall operations of the memory device 100. The control logic 125 receives a command CMD and an address ADDR. The control logic 125 controls the address decoder 121, the voltage generator 122, the read/write circuit 123, and the data input/output circuit 124 in response to the command CMD.

Figure 7:
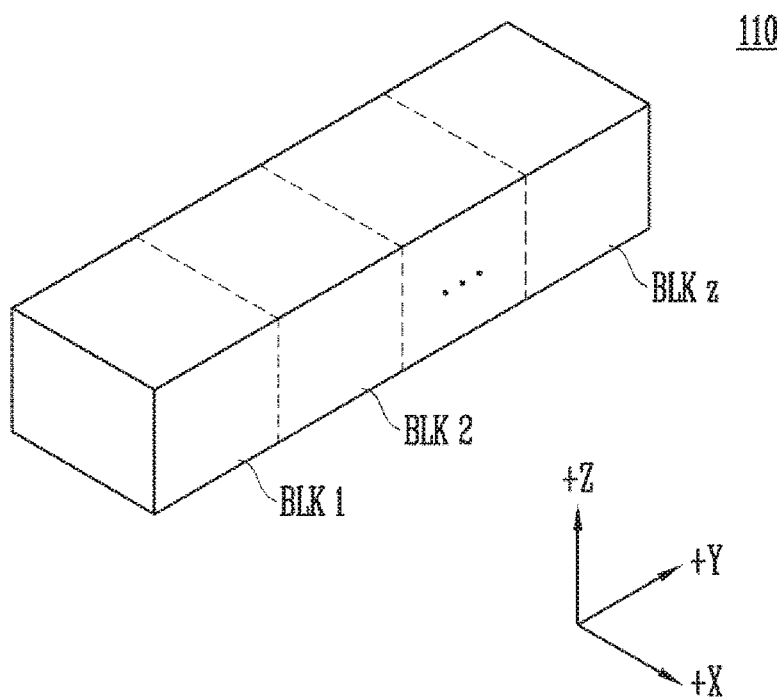
FIG. 7 is a diagram illustrating an embodiment of a memory cell array, such as that shown in FIG. 6.

FIG. 7 is a diagram illustrating an embodiment of the memory cell array shown in FIG. 6.

Referring to FIG. 7, the memory cell array 110 may include a plurality of memory blocks BLK1 to BLKz. Each memory block, as well as the memory cell array 110 itself, may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 8 and 9.

Figure 8:
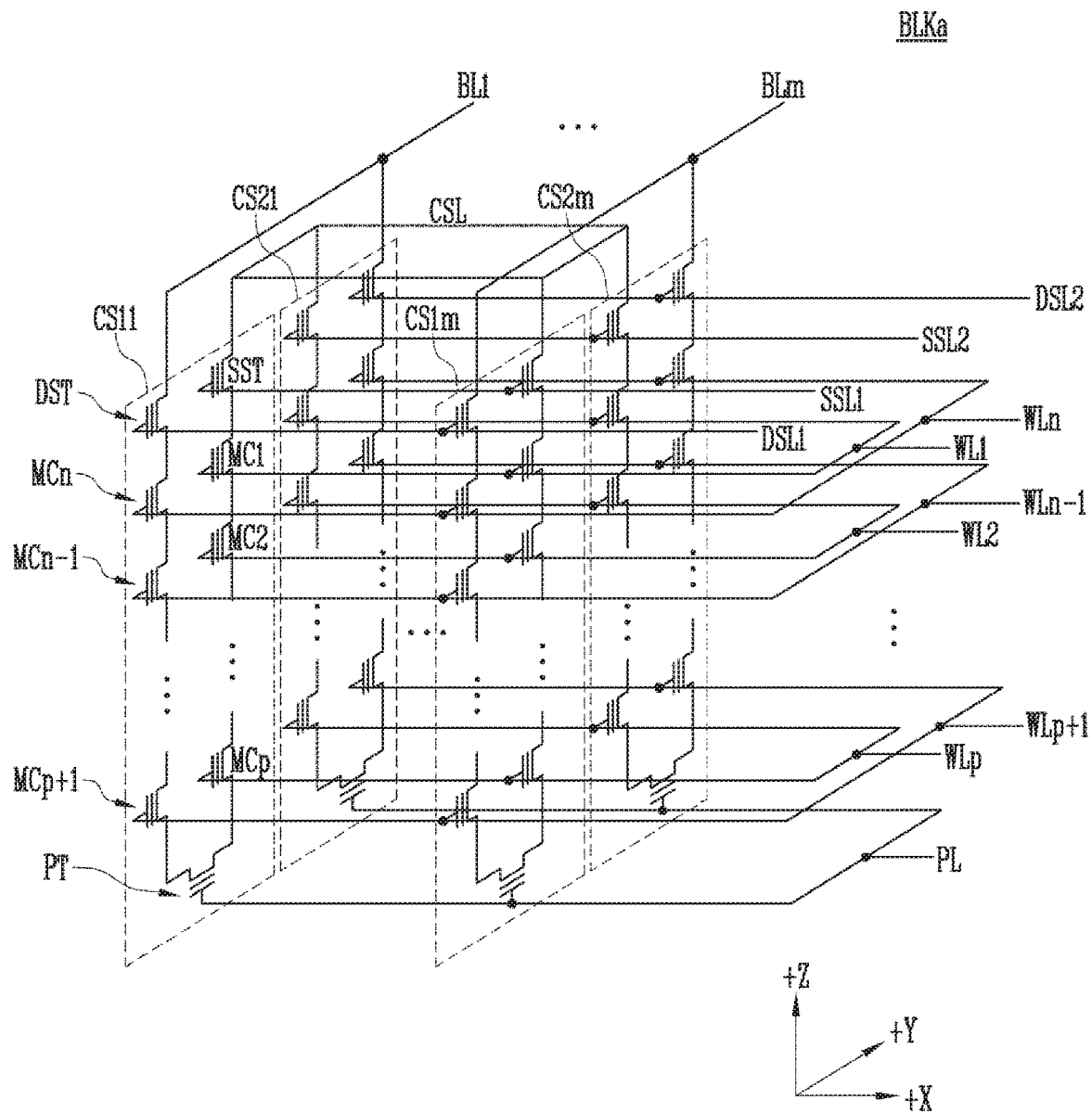
FIG. 8 is a circuit diagram illustrating an exemplary memory block among memory blocks, such as those shown in FIG. 7.

FIG. 8 is a circuit diagram illustrating an exemplary memory block BLKa among the memory blocks BLK1 to BLKz shown in FIG. 7.

Referring to FIG. 8, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 8 illustrates two cell strings arranged in a column direction (i.e., a +Y direction). However, this is for clarity; it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 8, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may include first to pth memory cells MC1 to MCp and a (p+1)th to nth memory cells MCp+1 to MCn. The first to pth memory cells MC1 to MCp are sequentially arranged in the −Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 8, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each of the dummy memory cells may have a required threshold voltage. Before or after an erase operation of the memory block BLKa, a program operation may be performed on all or some of the dummy memory cells. When an erase operation is performed after the program operation is performed, by controlling a voltage applied to the dummy word lines coupled to the respective dummy memory cells, the dummy memory cells can have the required threshold voltage.

Figure 9:
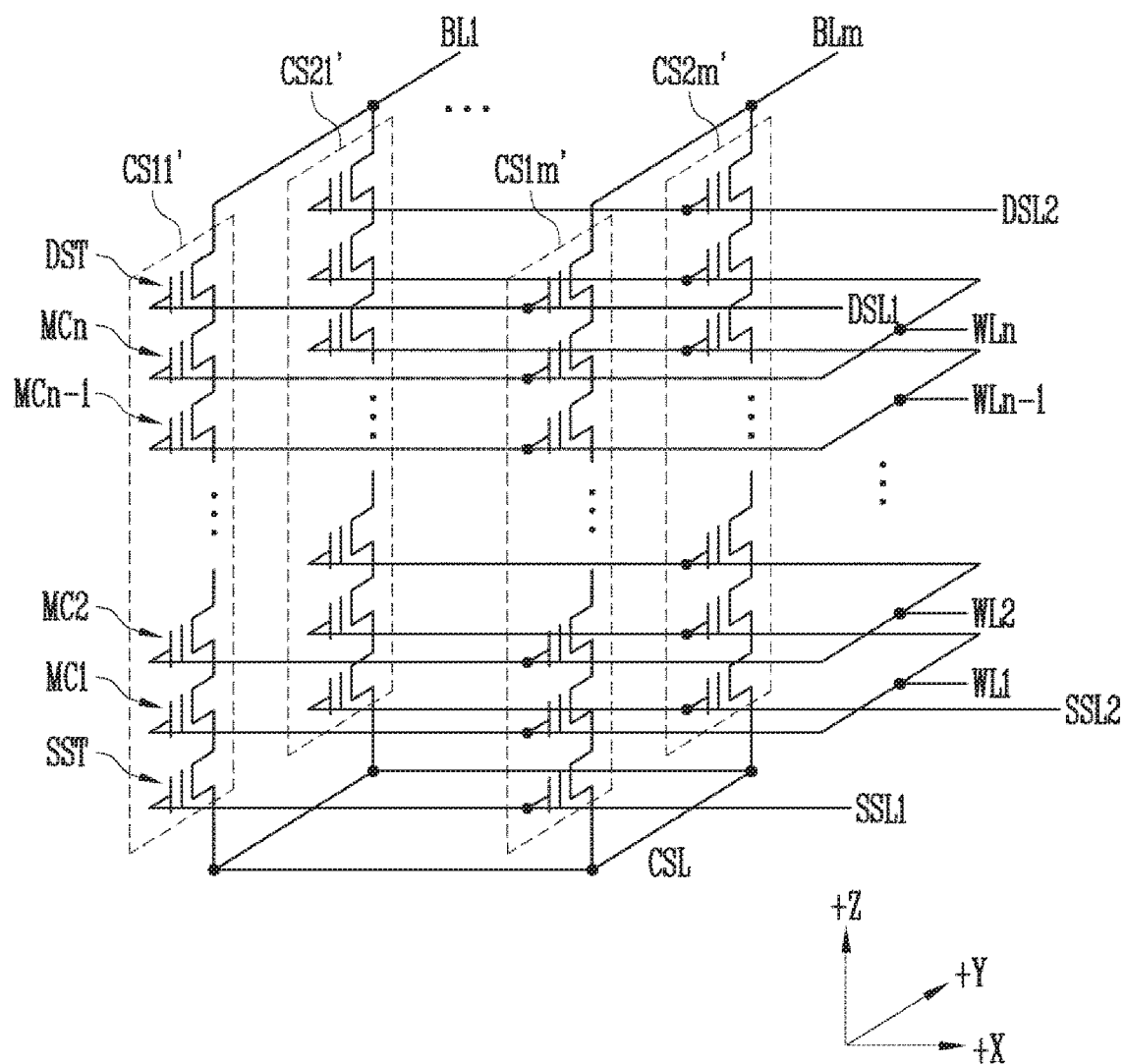
FIG. 9 is a circuit diagram illustrating another embodiment of a memory block among memory blocks, such as those shown in FIG. 7.

FIG. 9 is a circuit diagram illustrating another embodiment BLKb of an exemplary memory block among the memory blocks BLK1 to BLKz shown in FIG. 7.

Referring to FIG. 9, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line 55L2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 9 has a circuit similar to that of the memory block BLKa of FIG. 8, except that the pipe transistor PT is excluded from each cell string in FIG. 9.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCn. Alternatively, the dummy memory cell(s) may be provided to decrease an electric field between the drain select transistor DST and the memory cells MC1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each of the dummy memory cells may have a required threshold voltage. Before or after an erase operation of the memory block BLKb, a program operation may be performed on all or some of the dummy memory cells. When an erase operation is performed after the program operation is performed, by controlling a voltage applied to the dummy word lines coupled to the respective dummy memory cells, the dummy memory cells can have the required threshold voltage.

Figure 10:
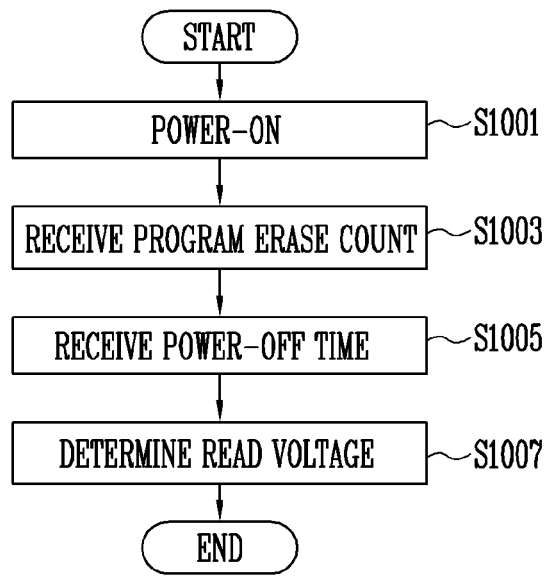
FIG. 10 is a flow chart illustrating an operation of a memory controller in accordance with an embodiment of the present disclosure.

FIG. 10 is a diagram illustrating an operation of the memory controller 200 in accordance with an embodiment of the present disclosure.

Referring to FIG. 10, in step S1001, the memory device 100 may be powered-on, which may refer to power being applied to the memory device 100. Therefore, a power-on time of the memory device 100 may be a time at which the power is applied to the memory device 100. The power-on time may be an end time when a retention period is calculated. The time at which the power is applied to the memory device 100 may be determined based on a power-on state sensed in the host 300 or the memory controller 200.

In step S1003, the remaining count determiner 210 may receive a program/erase count EW_COUNT from the memory device 100. The program/erase count EW_COUNT may be a number of program and erase operations performed in the memory device 100. The remaining count determiner 210 may determine a remaining count based on the program/erase count EW_COUNT. The remaining count may be a number of program and erase operations to be additionally performed in the memory device 100. The number of program and erase operations to be additionally performed in the memory device 100 may be indicative of a remaining lifespan of the memory device 100. Therefore, the remaining count may represent a remaining lifespan of the memory device 100.

In step S1005, the retention period calculator 220 may receive a power-off time PO_TIME from the memory device 100. Specifically, the power-off time PO_TIME may be a time at which the power applied to the memory device 100 was turned off or otherwise interrupted immediately before the current power-on time. The retention period is calculated as the period between the power-off time PO_TIME and the current power-on time.

When the power is applied to the memory device 100, the retention period calculator 220 may receive the power-off time PO_TIME from the memory device 100. Alternatively, the retention period calculator 220 may receive the power-off time PO_TIME from the memory device 100 in response to a request from the memory controller 200. The retention period calculator 220 may calculate a retention period based on the power-off time PO_TIME received from the memory device 100. The retention period may be a period from the time at which the power applied to the memory device 100 is most recently off to the time at which the power then starts to be applied to the memory device 100.

In step S1007, the read voltage determiner 230 may determine a read voltage used in the memory device 100 based on the default read voltage table, the coefficient corresponding to the remaining count and the retention period.

Specifically, the read voltage determiner 230 may generate a new read voltage table based on a default read voltage table and the coefficient corresponding to the remaining count. The newly generated voltage table is referred to as a changed read voltage table. The read voltage determiner 230 may determine a read voltage corresponding to the retention period among voltages included in the changed read voltage table.

Figure 11:
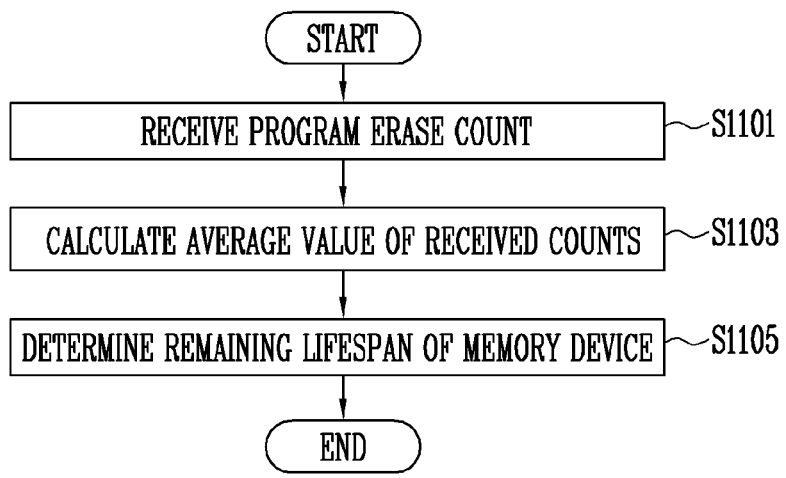
FIG. 11 is a flow chart illustrating an operation of a memory controller in accordance with an embodiment of the present disclosure.

FIG. 11 is a diagram illustrating an operation of the memory controller 200 in accordance with an embodiment of the present disclosure.

Referring to FIG. 11, in step S1101, the remaining count determiner 210 may receive the program/erase count EW_COUNT from the memory device 100, which may include such count for each memory block of the memory device 100.

In step S1103, the remaining count determiner 210 may calculate an average value of program/erase counts EW_COUNT of the individual memory blocks. The remaining count determiner 210 may calculate an average value of program/erase counts received from the respective memory blocks.

In another embodiment, the remaining count determiner 210 may calculate a median value of the program/erase counts EW_COUNT for the respective memory blocks. Alternatively, the remaining count determiner 210 may calculate a maximum value or minimum value among the program/erase counts EW_COUNT for the respective memory blocks.

In step S1105, the remaining count determiner 210 may determine a remaining lifespan of the memory device 100. Specifically, the remaining count determiner 210 may determine the remaining count based on the program/erase count EW_COUNT. The remaining count may be a number of program and erase operations to be additionally performed in the memory device 100, which in turn may be representative of the remaining lifespan of the memory device 100. That is, the remaining lifespan of the memory device 100 may be determined based on a number of program and erase operations to be performed in the memory device 100.

Consequently, the remaining count determiner 210 may determine the remaining lifespan of the memory device 100 as any of End Of Life (EOL), NORMAL, and Start Of Life (SOL) based on the received program/erase count EW_COUNT. In another embodiment, the remaining lifespan of the memory device 100 may include other representations, which may be refinements of the EOL, the NORMAL, and the SOL.

Figure 12:
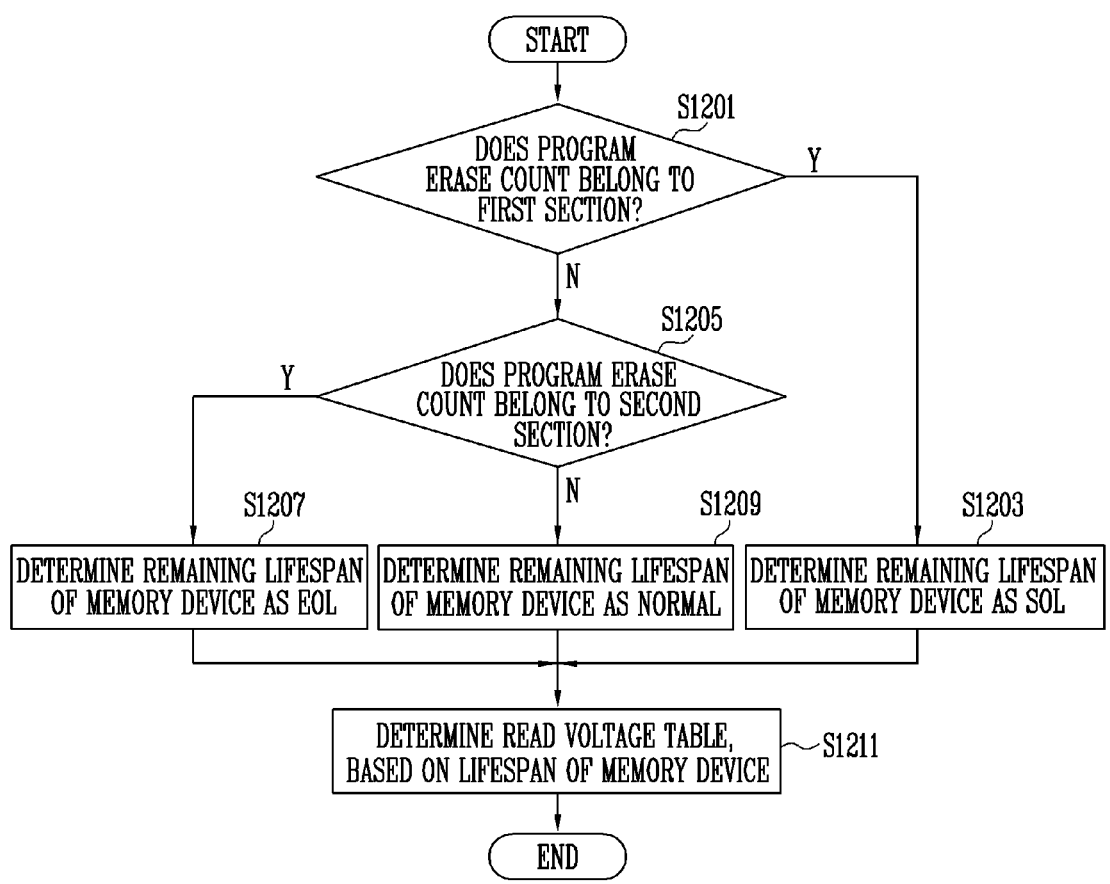
FIG. 12 is a flow chart illustrating an operation of a memory controller in accordance with an embodiment of the present disclosure.

FIG. 12 is a diagram illustrating an operation of the memory controller 200 in accordance with an embodiment of the present disclosure.

Referring to FIGS. 3 and 12, at step S1201, the remaining count determiner 210 may determine whether a program/erase count EW_COUNT received from the memory device 100 belongs to a first section, i.e., EW_COUNT≤q1, shown in the table of FIG. 3. When the program/erase count EW_COUNT belongs to the first section, the remaining count determiner 210 proceeds to step S1203. When the program/erase count EW_COUNT does not belong to the first section, the remaining count determiner 210 proceeds to step S1205.

In the step S1203, the remaining count determiner 210 may determine a remaining lifespan of the memory device 100 as Start Of Life (SOL). When the remaining lifespan of the memory device 100 is the SOL, a relatively large number of program and erase operations may be performed in the memory device 100.

In the step S1205, the remaining count determiner 210 may determine whether the program/erase count EW_COUNT received from the memory device 100 belongs to a second section, i.e., EW_COUNT≥q2, shown in the table of FIG. 3. When the program/erase count EW_COUNT belongs to the second section, the remaining count determiner 210 proceeds to step S1207. When the program/erase count EW_COUNT does not belong to the second section, the remaining count determiner 210 proceeds to step S1209.

In the step S1207, the remaining count determiner 210 may determine the remaining lifespan of the memory device 100 as End Of Life (EOL). When the remaining lifespan of the memory device 100 is the EOL, a relatively small number of program and erase operations may be performed in the memory device 100.

In the step S1209, which is reached when the EW_COUNT does not belong to either of the first or second sections, the remaining count determiner 210 may determine the remaining lifespan of the memory device 100 as NORMAL, which corresponds to q1<EW_COUNT<q2. When the remaining lifespan of the memory device 100 is the NORMAL, a large number of program and erase operations may be performed in the memory device 100, as compared with when the remaining lifespan of the memory device 100 is the EOL.

In step S1211, the read voltage determiner 230 may determine the new read voltage table based on the remaining lifespan of the memory device 100. Specifically, the remaining lifespan of the memory device 100 may be determined based on the program/erase count EW_COUNT. A remaining count is determined according to the program/erase count EW_COUNT, and therefore, the remaining lifespan of the memory device 100 may be determined according to the remaining count.

Consequently, when the remaining lifespan of the memory device 100 is determined, the read voltage determiner 230 may generate the changed read voltage table based on the default read voltage table corresponding to one of a plurality of remaining lifespans and the coefficient corresponding to the remaining count.

Figure 13:
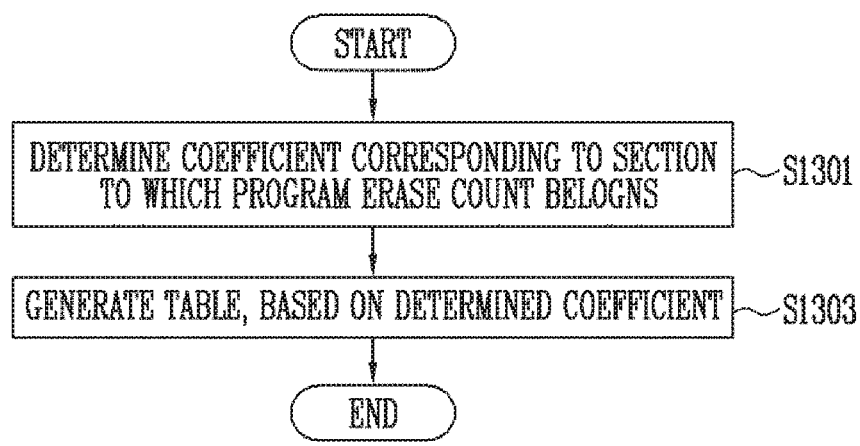
FIG. 13 is a flow chart illustrating an operation of a memory controller in accordance with an embodiment of the present disclosure.

FIG. 13 is a diagram illustrating an operation of the memory controller 200 in accordance with an embodiment of the present disclosure.

FIG. 13 shows the step S1211 in detail.

In step S1301, the remaining count determiner 210 may determine a coefficient corresponding to the section to which the program/erase count EW_COUNT belongs. A remaining count may be determined based on the EW_COUNT, as previously explained.

Specifically, the remaining count determiner 210 may determine a coefficient corresponding to the remaining count determined according to the program/erase count EW_COUNT. Therefore, the remaining count determiner 210 may determine a coefficient corresponding for the section to which the program/erase count EW_COUNT belongs.

In step S1303, the read voltage determiner 230 may generate the changed read voltage table based on the default read voltage table and the determined coefficient. For example, the determined coefficient may be "0.2" indicating that a remaining lifespan is 20% of total lifespan or "0.8" indicating that a remaining lifespan is 80% of total lifespan.

Voltages included in the changed read voltage table may be voltages obtained by multiplying read voltages included in the default read voltage table by the determined coefficient. That is, the read voltage determiner 230 may generate a changed read voltage table based on a remaining lifespan of the memory device 100, which determines the default read voltage table, and the coefficient corresponding to the remaining count.

The read voltage determiner 230 may determine a read voltage corresponding to a retention period among the voltages included in the changed read voltage table as a read voltage used in the memory device 100.

Figure 14:
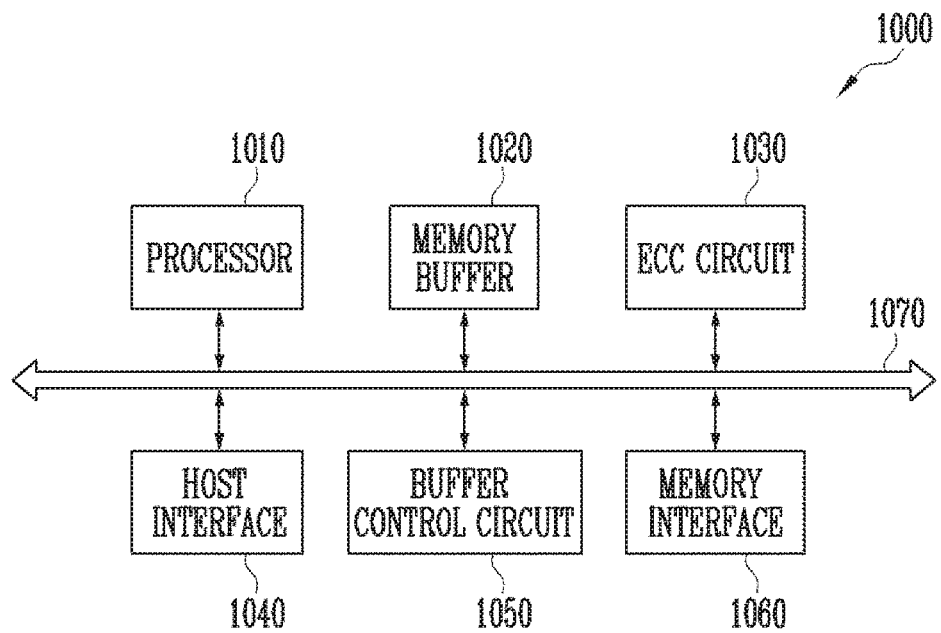
FIG. 14 is a diagram illustrating another embodiment of the memory controller shown in FIG. 1.

FIG. 14 is a diagram illustrating another embodiment of the memory controller shown in FIG. 1.

A memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 14, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. Representative address mapping methods include a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. Either or both of these components may be provided separately or one or both of their functions distributed within the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other so as not to interfere with, or influence, each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 15:
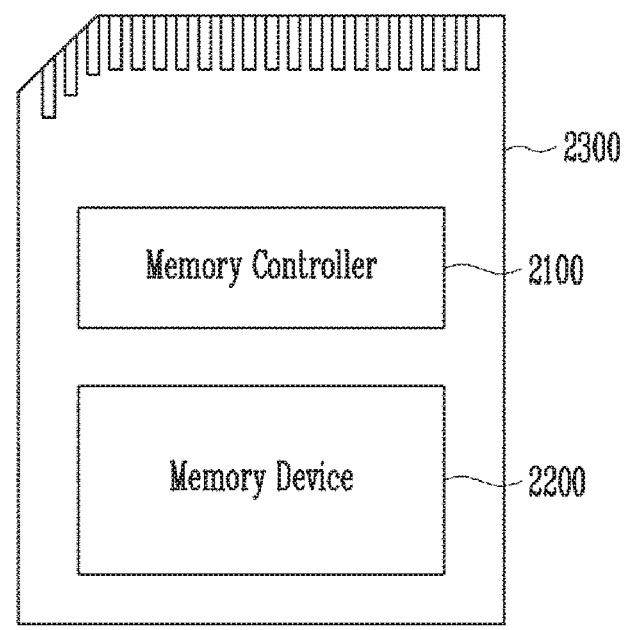
FIG. 15 is a block diagram illustrating a memory card system to which the storage device is applied in accordance with an embodiment of the present disclosure.

FIG. 15 is a block diagram illustrating a memory card system to which the storage device is applied in accordance with an embodiment of the present disclosure.

Referring to FIG. 15, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 described with reference to FIG. 6.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card such as a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 16:
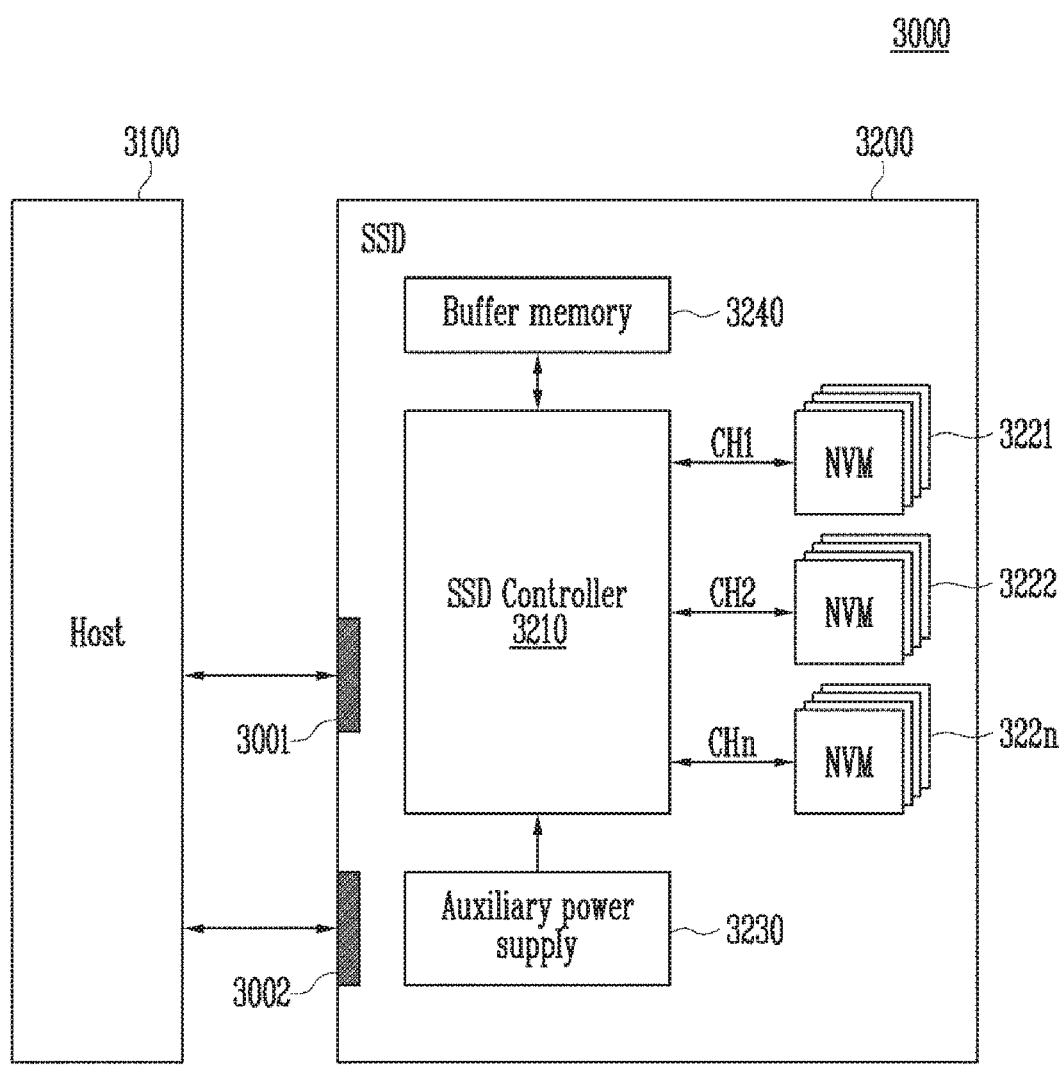
FIG. 16 is a block diagram illustrating a Solid State Drive (SSD) system to which the storage device is applied in accordance with an embodiment of the present disclosure.

FIG. 16 is a block diagram illustrating a Solid State Drive (SSD) system to which the storage device is applied in accordance with an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 17:
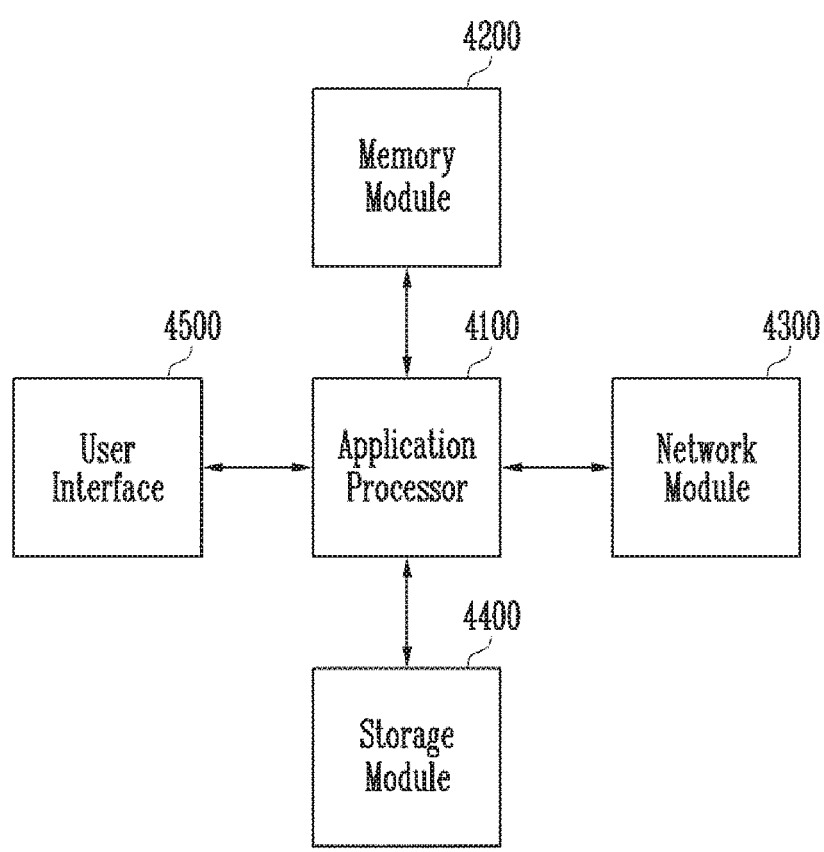
FIG. 17 is a block diagram illustrating a user system to which the storage device is applied in accordance with an embodiment of the present disclosure.

FIG. 17 is a block diagram illustrating a user system to which the storage device is applied in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 6 to 9. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a memory controller having an improved operation speed and an operating method thereof are provided.

While the present invention has been shown and described with reference to certain embodiments thereof, it will be understood by those skilled in the art in light of the present disclosure that various changes in form and details may be made therein without departing from the spirit and scope of the present invention as defined by the appended claims and their equivalents. Therefore, the scope of the present invention should not be limited to the above-described embodiments but should be determined by the appended claims and equivalents thereof.

In the above-described embodiments, any or all steps may be selectively performed or part of the steps and may be omitted. In each embodiment, the steps are not necessarily performed in accordance with the described order and may be rearranged. The embodiments disclosed herein are to facilitate an understanding of the present invention, not limit it. The present invention encompasses various modifications apparent to those skilled in the art, which modifications can be made on the basis of the technological scope of the present disclosure.

Although specific terminologies are used here, those are only to explain the embodiments of the present disclosure. Therefore, the present invention is not restricted by specific terminology, as many variations are possible within the spirit and scope of the present disclosure.

What is claimed is:

1. A memory controller for controlling a memory device including a plurality of memory blocks, the memory controller comprising:
    a remaining count determiner configured to determine a remaining count that is a number of program and erase operations to be additionally performed in the memory device based on a program/erase count received from the memory device;
    a retention period calculator configured to determine a retention period based on a power-off time and a power-on time of the memory device; and
    a read voltage determiner configured to generate a changed read voltage table based on a default read voltage table and a coefficient determined according to the remaining count, and determine a read voltage to be used in the memory device, according to the retention period, from among read voltages included in the changed read voltage table,
    wherein the read voltage determiner generates the changed read voltage table by multiplying read voltages included in the default read voltage table by the coefficient.

2. The memory controller of claim 1, wherein the remaining count determiner generates and outputs remaining count information including information on the remaining count and the coefficient to the read voltage determiner.

3. The memory controller of claim 1, wherein, as the program/erase count increases, the remaining count and the coefficient decrease.

4. The memory controller of claim 3, wherein the remaining count determiner determines the remaining count based on a representative value of the program/erase count.

5. The memory controller of claim 4, wherein the representative value of the program/erase count is any one of an average value, median value, maximum value or minimum value of program/erase counts with respect to the plurality of memory blocks.

6. The memory controller of claim 3, wherein the retention period is a period from the power-off time to the power-on time.

7. The memory controller of claim 6, wherein the read voltage used in the memory device is decreased as the retention period becomes longer.

8. The memory controller of claim 3, wherein the retention period calculator determines the retention period by receiving the power-off time from the memory device and receiving power-on information in the memory controller.

9. The memory controller of claim 3, wherein the read voltage determiner generates and outputs read voltage information based on the read voltage used in the memory device.

10. A method for operating a memory controller for controlling a memory device including a plurality of memory blocks, the method comprising:
    determining a remaining count that is a number of program and erase operations to be additionally performed in the memory device based on a program/erase count received from the memory device;
    determining a retention period, based on a power-off time and a power-on time of the memory device;
    generating a changed read voltage table based on a default read voltage table and a coefficient determined according to the remaining count; and
    determining a read voltage used in the memory device, according to the retention period, from among read voltages included in the changed read voltage table,
    wherein the changed read voltage table is generated by multiplying read voltages included in the default read voltage table by the coefficient.

11. The method of claim 10, further comprising generating and outputting remaining count information including information on the remaining count and the coefficient.

12. The method of claim 10, wherein, as the program/erase count increases, the remaining count and the coefficient decrease.

13. The method of claim 10, wherein the remaining count is determined based on an average value of program/erase counts with respect to the plurality of memory blocks, which are received from the memory device.

14. The method of claim 10, wherein the remaining count is determined based on a maximum count value or minimum count value among program/erase counts with respect to the plurality of memory blocks, which are received from the memory device.

15. The method of claim 10, wherein the retention period is determined as a period from the power-off time to the power-on time.

16. The method of claim 15, wherein the read voltage used in the memory device is determined to be lower as the retention period becomes longer.

17. The method of claim 10, wherein the determining of the read voltage includes:
    receiving the power-off time from the memory device; and
    receiving power-on information in the memory controller.

18. The method of claim 10, further comprising generating and outputting read voltage information, based on the read voltage used in the memory device.

* * * * *